United States Patent [19]
Crowley et al.

[11] Patent Number: 5,999,838
[45] Date of Patent: Dec. 7, 1999

[54] SPREAD SPECTRUM MRI

[75] Inventors: Christopher W. Crowley, San Diego; Freeman H. Rose, Jr., Del Mar; Robert A. Bell, Encinitas, all of Calif.

[73] Assignee: Panacea Medical Laboratories, Carlsbad, Calif.

[21] Appl. No.: 08/933,612

[22] Filed: Jul. 24, 1997

[51] Int. Cl.$^6$ ...................................................... A61B 5/055
[52] U.S. Cl. .......................... 600/410; 324/307; 324/309; 324/312
[58] Field of Search ............................ 600/410; 324/307, 324/309, 312, 318, 322, 313, 311

[56] References Cited

U.S. PATENT DOCUMENTS

| | | |
|---|---|---|
| 4,296,378 | 10/1981 | King . |
| 4,471,306 | 9/1984 | Edelstein et al. . |
| 4,542,343 | 9/1985 | Brown . |
| 4,656,425 | 4/1987 | Bendel . |
| 4,689,567 | 8/1987 | Maudsley . |
| 5,023,554 | 6/1991 | Cho et al. . |
| 5,099,208 | 3/1992 | Fitzpatrick et al. . |
| 5,150,052 | 9/1992 | Meyerand ............................... 324/309 |
| 5,304,930 | 4/1994 | Crowley et al. . |
| 5,493,225 | 2/1996 | Crowley et al. . |
| 5,755,666 | 5/1998 | Bornert .................................. 600/410 |

*Primary Examiner*—Marvin M. Lateef
*Assistant Examiner*—Eleni Mantis Mercader
*Attorney, Agent, or Firm*—Nydegger & Associates

[57] ABSTRACT

A method for acquiring data from voxels in a contour of tissue includes positioning the tissue in a magnetic field. For the present method, a z-gradient is imposed on the contour tissue to spread the spectrum of all of the voxels over a same range of Larmor frequencies. Additionally, voxels in the contour tissue are selectively encoded with different x-gradients and y-gradients to distinguish the various voxels from each other. In the presence of the z-gradient, nuclei of the encoded voxel are tilted and then refocused at a rate proportional to the z-gradient. Due to this refocusing, spin echo signals are generated which are useful for acquiring data from the tissue. The intravoxel z-gradient used for the present invention is the same for all voxels and is greater than either the x-gradient or the y-gradient which are used for encoding. The z-gradient may be substantially constant. Importantly, the z-gradient is sufficiently extensive to spread the spectrum of the spin echo signals for suppression of exogenous noise and make the signals immune to static field perturbations.

23 Claims, 1 Drawing Sheet

SPREAD SPECTRUM MRI

FIELD OF THE INVENTION

The present invention pertains generally to methods for acquiring data that is useful for magnetic resonance imaging (MRI). More particularly, the present invention pertains to methods and techniques for acquiring image data for magnetic resonance imaging when the magnetic field is characterized by a z-gradient. The present invention is particularly, but not exclusively, useful for employing spread spectrum techniques in magnetic resonance imaging to suppress exogenous noise, to make MRI signals immune to static field perturbations and to overcome perceived inefficiencies of nonhomogeneous magnetic fields.

BACKGROUND OF THE INVENTION

Magnetic resonance imaging is a well known and widely used method for obtaining medical images for both diagnostic and research purposes. In order to conduct a typical MRI procedure a volume of tissue is first placed in a static magnetic field. The tissue is then irradiated with radio frequency energy to tilt the nuclear magnetic moments within the tissue. Spin echo signals, which are characteristic of the irradiated tissue, are then recorded from the tilted nuclear magnetic moments. By using imaging techniques well known in the art, the signal contributions of individual volume elements (voxels) in the tissue are distinguished from each other. These voxels are ultimately displayed on a computer monitor or film for use by the physician or researcher.

For any system which relies on nuclear magnetic resonance techniques for acquiring data, one very important design consideration is the system's static magnetic field. For purposes of discussing the static magnetic field, consider an orthogonal x-y-z coordinate system. With the origin of this coordinate system at any point in the magnetic field, the magnetic field at that particular point can be characterized by the respective x, y and z components of the field and by spatial derivatives of the field strength. Specifically, the x, y and z components of the field magnetic vector, $\overline{B}_0$, are designated $B_x$, $B_y$ and $B_z$. The magnetic field can then be further characterized by the gradients which are the rate of change (first derivatives) of the field strength in the x, y and z directions. The field gradients are designated $G_x$, $G_y$ and $G_z$. It is to be appreciated that higher order derivatives may, and most likely are, present. For purposes of discussing the present invention, however, only the field gradients $G_x$, $G_y$ and $G_z$ need be considered.

In a very general sense, a homogeneous magnetic field exists in a small neighborhood of a point where all of the field gradients, i.e. $G_x$, $G_y$ and $G_z$, are zero.

To by-pass the difficulties encountered with the manufacture of homogeneous MRI systems, recent efforts have been made to effectively use the more commonplace and more cost effectively established nonhomogeneous magnetic field. For example, U.S. Pat. No. 5,304,930 which is assigned to the assignee of the present invention, and which issued to Crowley et al. for an invention entitled "Remotely Positioned MR1 System" (hereinafter the '930 patent) discloses a device and method for magnetic resonance imaging with a nonhomogeneous magnetic field. As clearly disclosed in the '930 patent, a nonhomogeneous field is a field that has a non-zero gradient $G_z$. Regardless whether the magnetic field is homogeneous or nonhomogeneous, in order to perform an MRI procedure it is necessary to distinguish various voxels within the tissue to be imaged. To do this, the tissue is typically encoded with spatial patterns.

One widely recognized encoding procedure for imparting spatial patterns in the tissue volume to be imaged involves the application of gradient magnetic fields. These so-called gradient magnetic fields consist of an additional range of field values, denoted by $\Delta B_o$, that are superimposed on the static field. At this point it should be noted that the x and y spatial variations of $\Delta B_o$ are determined by the respective x and y gradients, $G_x$ and $G_y$, of the superimposed field values. Through the Larmor constant, a range of Larmor frequencies determined by the expression $$\Delta f = \lambda \Delta B_o$$

exists during the application of the gradient, either $G_x$ or $G_y$ or both. The effect of this range of Larmor frequencies is a spatial pattern of phase accumulation in the magnetic moments across the tissue of interest. For the purposes of the present invention, the key point is that the range of Larmor frequencies associated with a gradient field ($G_x$ or $G_y$) spatially distinguish one voxel from another in the respective x and y directions. With a suitable number of gradient encodings, which are each followed by a measurement of spin echo signals, data is obtained that can be reconstructed into an image of the array of voxels.

Due to the fact the present invention contemplates an MRI operation with a z-gradient ($G_z$), several consequences which involve data acquisition and the suppression of exogenous noise are pertinent. First, the data acquisition techniques in the presence of a z-gradient are quite different from those used for conventional MR1 in a homogeneous magnetic field. This data acquisition aspect has been fully considered and disclosed in U.S. Pat. No. 5,304,930, which has been cited above and which is incorporated herein by reference. Second, the suppression of exogenous noise is accomplished by imposing a z-gradient, $G_z$, which is greater than either the x or y encoding gradients ($G_x$ and $G_y$). An additional benefit from this relationship between the gradients is the fact that the system is less sensitive to static field perturbations.

Spread spectrum techniques are widely used in the communications industry to avoid the corruption of transmitted signals by interfering noise sources. The method is particularly effective in the presence of a discrete set of noise sources that occupy narrow frequency bands. Conventional radio or television signals fall into this category.

The basic idea in spread spectrum techniques is to send and receive signals that occupy a range of frequencies that is significantly wider than that of the individual interfering noise sources. In this manner, the effects of the individual noise sources are minimized.

The use of such techniques is not conventionally taught in the art since, as mentioned above, most magnetic resonance equipment can be shielded from the effect of external noise by enclosing the system in an r.f. shielded room (Faraday cage). However, the present invention recognizes there are benefits to systems that are not enclosed in shielded rooms, especially for cost of operation and smaller portable systems.

In light of the above, it is an object of the present invention to provide methods for acquiring data from voxeis in a contour of tissue which is accomplished using a z-gradient, $G_z$. It is another object of the present invention to provide methods for acquiring data from voxels in a contour of tissue which uses an extensive z-gradient, $G_z$, to suppress exogenous noise making the data less sensitive to static field perturbations. Still another object of the present invention is to provide methods for MRI which are relatively easy to accomplish and comparatively cost effective.

SUMMARY OF THE INVENTION

A method in accordance with the present invention involves positioning a tissue sample to be imaged in a magnetic field. Specifically, a nonhomogeneous magnetic field will have a permanent z-gradient ($G_z$) which may be intentionally imposed, but is most typically an inherent characteristic of the magnet system that generates the magnetic field.

Once the tissue sample has been positioned in the magnetic field and the z-gradient, $G_z$, is imposed, a slice or contour of the tissue sample is excited by the application of RF energy. The transmission of this RF energy corresponds to the range of Larmor frequencies in the contour, which will be the same for all voxels in the contour. The tissue sample is then subsequenty impressed with an x-gradient ($G_x$) and a y-gradient ($G_y$). The effect of impressing the x and y gradients ($G_x$, $G_y$) on the tissue sample is to encode a portion of the tissue as a contour of voxels. Due to this encode, each of the voxels will have its own slightly different field strengths in the x and y directions. It is this spatial information which distinguishes one voxel from another voxel in the contour. On the other hand, as indicated above, all of the voxels in the contour are subjected to the same z-gradient. Thus, rather than distinguishing the voxels from each other, the effect of the z-gradient is to spread the spectrum of each of the encoded voxels. Importantly, the z-gradient ($G_z$) is typically orders of magnitude (i.e. ten to one hundred times) larger than either the x-gradient ($G_x$) or the y-gradient ($G_y$).

As is well known in the art, tilted nuclei generate spin echo signals which contain informational data that can be received and processed to image the tissue. For the present invention, the x, y and z gradients are appropriately activated, and the nuclei in the tilted and encoded voxels are refocused to form spin echoes which are received for data acquisition purposes. Specifically, as disclosed in great detail in the '930 patent, the data acquisition process envisioned by the present invention involves a series of refocusing pulses which are applied at a rate that is proportional to the z-gradient.

Several aspects of the present invention are particularly noteworthy. Firstly, the z-gradient does not impart encoding patterns. Nevertheless, the z-gradient causes all of the voxels' spins to oscillate at a same range of Larmor frequencies. Further, the extensive z-gradient allows use of spread spectrum techniques for the suppression of exogenous noise and desensitization to static field perturbations.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
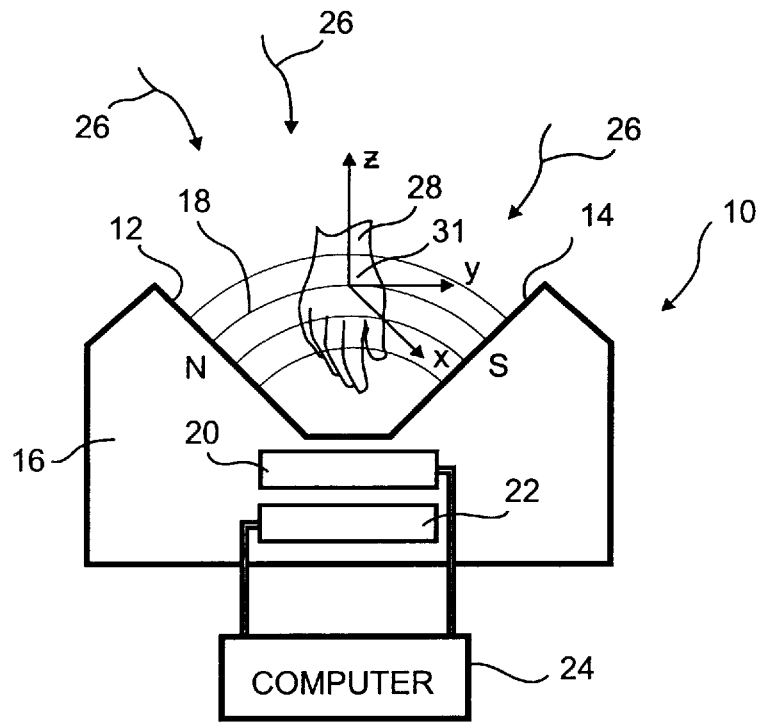
FIG. 1 is a schematic drawing of the components of a magnet system which is usable for the present invention.

Referring initially to FIG. 1, a magnet system in accordance with the present invention is shown and generally designated 10. As shown, the magnet system includes a North pole face 12 and a South pole face 14 which are both mounted on a base 16. As mounted on the base 16, North pole face 12 and the South pole face 14 generate a magnetic field which is represented by the magnetic field lines 18. On the preferred embodiment, the magnetic field is nonhomogeneous and, with reference to the orthogonal x-y-z coordinate system, the magnetic field has an inherent permanent z-gradient, $G_z$. For purposes of the present invention, $G_z$ will be above approximately 0.2 gauss per millimeter and, most likely, will be somewhere around 3 gauss per millimeter.

FIG. 1 also shows that the system 10 includes a transmitting antenna system 20 and a receiving antenna system 22 which are both mounted on the base 16. As will be appreciated by the skilled artisan, for the purposes of the present invention many types of antenna systems 20, 22 can be used either separately or in combination in any manner well known in the art. In any case, the antenna systems 20, 22 are connected to a computer 24 which will control the transmission and reception of signals from the antenna systems 20, 22.

As intended for the present invention, the magnet system 10 is designed with unshielded pole faces 12, 14 which are small enough to make the system 10 portable. Consequently, in addition to the permanent z-gradient, the magnetic field 18 will also be subjected to unpredictable exogenous noise and static field perturbation which are represented by the arrows 26 in FIG. 1.

FIG. 1 also shows a tissue sample 28 (e.g. a hand) that has been positioned in the magnetic field of magnet system 1 0. It is to be appreciated that the tissue sample 28 can be oriented as desired. In all cases, however, the portion of tissue which will be imaged lies in an x-y plane, a slice or contour, which is perpendicular to the z axis and which is, thus, also perpendicular to the z-gradient ($G_z$).

Figure 2:
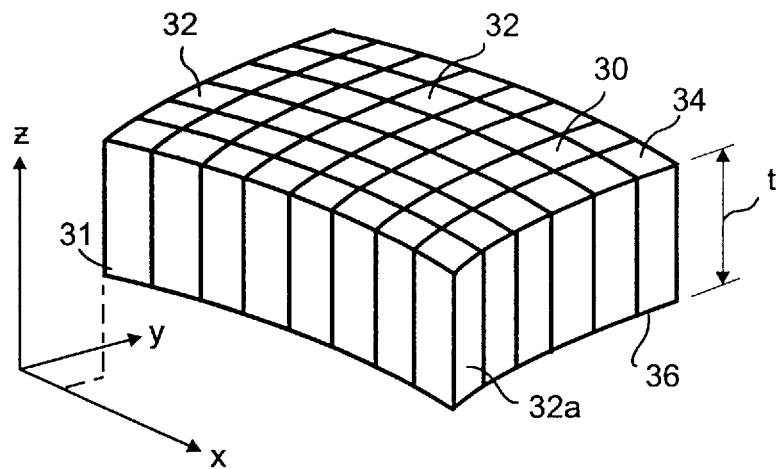
FIG. 2 is an idealized visualization of a contour of voxels which are imaged by the methods of the present invention.

FIG. 2 shows a representative contour 30 from the tissue sample 28 which is to be imaged. As shown, for a point 31 in the x-y-z coordinate system, the contour 30 includes a plurality of voxels 32 of which the voxel 32a is representative. As also shown in FIG. 2, the contour 30 and the voxels 32 therein are bonded by an upper surface 34 and a lower surface 36. Accordingly, the contour 30 has a thickness t. importantly, the surfaces 34, 36 are each of constant field magnitude, $B_{OU}$ and $B_{OL}$ respectively, and, consequently, the surfaces have different Larmor frequencies, $f_{OU}$ and $f_{OL}$ respectively. As indicated by earlier disclosure, the range of Larmor frequencies ($f_{OU}$-$f_{OL}$) across the thickness t of the contour 30 is due to $G_z$. As stated above, $G_z$ will be greater than either $G_x$ or $G_y$ and, in most cases, much greater. Also, as defined herein, $G_z$ is permanent. Thus, $G_z$ will be imposed on the tissue sample 28 as soon as the tissue sample 28 is positioned in the magnetic field. Further, $G_z$ is the same for all of the voxels 32 in contour 30 and, thus, the range of Larmor frequencies will be the same for all voxels 32. Therefore, as used for the present invention, $G_z$ is, an intravoxel gradient. $G_x$ and $G_y$ are, in contrast, intervoxel gradients which serve to encode and thereby spatially differentiate the voxels 32 from each other.

Figure 3:
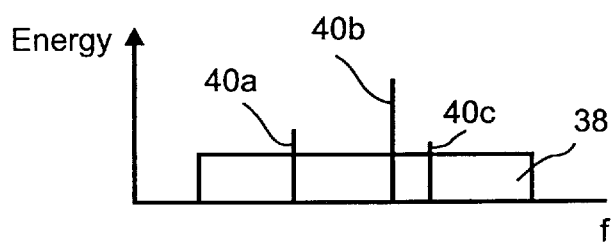
FIG. 3 is a comparison of the spectral densities of the static field gradient ($G_z$) and exogenous noise.

A method for operation in accordance with the present invention involves positioning a tissue sample 28 in the magnetic field of a magnet system 10. This magnetic field is characterized by a z-gradient, $G_z$. $G_z$ is preferably substantially constant and sufficiently large to suppress exogenous noise with spread spectrum techniques. Specifically, FIG. 3 shows how the intravoxel range of Larmor frequencies, which result from $G_z$, are spread in spectrum. As indicated in FIG. 3, the spectral density 38 resulting from the intravoxel gradient ($G_z$), is rather extensive. En contrast, spectral densities of interfering exogenous noise sources and static field perturbations, shown by the lines 40 a–c, are small relative to the spread in signal spectrum.

Once the tissue sample 28 has been properly positioned, the antenna system 20 is activated to tilt nuclei in the tissue sample 28. After the tilting of the nuclei, or before if desired, the tissue sample 28 is encoded with x and y gradients. The result is a contour 30 of encoded voxels 32. The contour 30 is then irradiated with refocusing pulses which cause the nuclei to generate receivable spin echo signals. All of the actions; tilting, encoding, and refocusing are controlled by the computer 24. The resultant spin echo signals are then received by the antenna system and passed to computer 24 ere they are processed as desired.

It is to be appreciated that the techniques disclosed herein are given in the context of a nonhomogeneous magnetic field. These techniques, however, are also applicable to homogeneous fields whenever a $G_z$ is superposed on the homogeneous field.

While the particular spread spectrum MRI, as herein shown and disclosed in detail, is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for acquiring data from voxels in a contour of tissue which comprises the steps of:
    positioning said tissue, in a magnetic field;
    impressing an encode gradient on said tissue to encode said voxels;
    imposing a z-gradient on said encoded voxels to spread the spectrum of all said voxels over a same range of Larmor frequencies, said z-gradient being greater than said x-y encode gradients; and
    acquiring data from said voxels over said same range of Larmor frequencies.

2. A method as recited in claim 1 further comprising the step of filtering said range of Larmor frequencies to attenuate exogenous noise.

3. A method as recited in claim 1 wherein said magnetic field is homogeneous.

4. A method as recited in claim 1 wherein said z-gradient is inherent and maintains a value greater than zero during said acquiring step.

5. A method as recited in claim 4 wherein said z-gradient is substantially constant during said acquiring step.

6. A method as recited in claim 1 wherein said z-gradient is greater than 0.2 gauss per millimeter.

7. A method as recited in claim 1 wherein said contour has a surface and said z-gradient is substantially perpendicular to said surface at said spread spectrum voxel.

8. A method as recited in claim 1 wherein said acquiring step further comprises the steps of:
    tilting nuclei in said spread spectrum voxel;
    refocusing said tilted nuclei at a rate proportional to said z-gradient to generate encoded spin echo signals; and
    receiving said encoded spin echo signals.

9. A method as recited in claim 8 further comprising the step of converting said encoded spin echo signals into an image.

10. A method as recited in claim 8 wherein said receiving step includes averaging said encoded spin echo signals.

11. A method for acquiring data from a single voxel in a plurality of voxels of a tissue sample positioned in a magnetic field which comprises the steps of:
    impressing at least one intervoxel gradient on said tissue to encode said voxel;
    imposing an intravoxel gradient on said tissue to spread the spectrum of all said encoded voxels over a same range of Larmor frequencies, said intravoxel gradient being greater than said intervoxel gradient; and
    acquiring data from said voxel over said same range of Larmor frequencies.

12. A method as recited in claim 11 wherein said intravoxel gradient is a z-gradient, and said intervoxel gradient includes an x-gradient and a y-gradient.

13. A method as recited in claim 12 wherein said z-gradient maintains a value greater than zero during said imposing step.

14. A method as recited in claim 12 wherein said z-gradient is substantially constant during said imposing step and has a value greater than 0.2 gauss per millimeter.

15. A method as recited in claim 11 wherein said contiguous voxels form a contour having a surface and said z-gradient is substantially perpendicular to said surface at said encoded voxel.

16. A method as recited in claim 11 further comprising the steps of:
    tilting nuclei in said encoded voxel;
    refocusing said tilted nuclei at a rate proportional to said z-gradient to generate encoded spin echo signals; and
    receiving said encoded spin echo signals.

17. A method as recited in claim 16 wherein said receiving step includes averaging said encoded spin echoes and said method further comprises the step of converting said averaged spin echo signals into an image.

18. A method for magnetic resonance processing which comprises the steps of:
    placing a tissue sample in a magnetic field;
    using a first bandwidth on a contour of said tissue to distinguish voxels therein; and
    using a second bandwidth on said tissue contour for spreading the spectrum of voxels therein over a same range of Larmor frequencies for reception of spin echo signals therefrom, said second bandwidth being greater than said first bandwidth, and said second bandwidth being extensive to suppress exogenous noise.

19. A method as recited in claim 18 further comprising the steps of:
    tilting nuclei in said voxels;
    refocusing said tilted nuclei at a rate proportional to said second bandwidth to generate encoded spin echo signals from said voxels;
    receiving said encoded spin echo signals; and
    converting said encoded spin echo signals into useable data.

20. A method as recited in claim 19 wherein said steps of using, tilting, refocusing, receiving and converting are repeated for a plurality of said voxels.

21. A method as recited in claim 20 wherein said receiving step includes averaging said encoded spin echo signals, and said converting step includes using said data to create an image of said tissue.

22. A method as recited in claim 19 wherein said first bandwidth results from an x-gradient and a y-gradient, and said second bandwidth results from a z-gradient.

23. A method as recited in claim 22 wherein said z-gradient is substantially constant and has a value greater than 0.2 gauss per millimeter during said receiving step.

* * * * *